(12) United States Patent
Mashimo et al.

(10) Patent No.: US 9,793,826 B2
(45) Date of Patent: Oct. 17, 2017

(54) METHOD OF MANUFACTURING A CIRCUIT DEVICE

(71) Applicant: SEMICONDUCTOR COMPONENTS INDUSTRIES, LLC, Phoenix, AZ (US)

(72) Inventors: Shigeaki Mashimo, Maebashi (JP); Fumio Horiuchi, Ashikaga (JP); Kiyoaki Kudo, Gunma (JP); Akira Sakurai, Tatebayashi (JP); Yuhki Inagaki, Kumagaya (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 15/003,958

(22) Filed: Jan. 22, 2016

(65) Prior Publication Data

US 2016/0211247 A1   Jul. 21, 2016

Related U.S. Application Data

(62) Division of application No. 13/242,202, filed on Sep. 23, 2011, now Pat. No. 9,275,930.

(30) Foreign Application Priority Data

Sep. 24, 2010  (JP) ................................. 2010-213694

(51) Int. Cl.
*H05K 3/30* (2006.01)
*H02M 7/537* (2006.01)
(Continued)

(52) U.S. Cl.
CPC ........ *H02M 7/537* (2013.01); *H01L 21/4825* (2013.01); *H01L 21/56* (2013.01);
(Continued)

(58) Field of Classification Search
CPC ......... H05K 3/30; H01L 21/60; H01L 23/495; H02M 7/00
(Continued)

(56) References Cited

U.S. PATENT DOCUMENTS 4,558,397 A   12/1985 Olsson
4,668,032 A    5/1987 Bouvier et al.
(Continued)

FOREIGN PATENT DOCUMENTS

JP   5-102645    4/1993
JP   10-135380   5/1998
(Continued)

OTHER PUBLICATIONS

Office Action dated Nov. 7, 2012, directed to Korean Application No. 1 0-2011-0096148; 4 pages.

*Primary Examiner* — Xiaoliang Chen
(74) *Attorney, Agent, or Firm* — Polansky & Associates, P.L.L.C.; Paul J. Polansky

(57) ABSTRACT

In one form, a method of manufacturing a circuit device comprises providing a lead frame comprising a plurality of leads, each comprising an island portion, a bonding portion elevated from the island portion, a slope portion extending obliquely so as to connect the island portion and the bonding portion, and a lead portion extending from the bonding portion. The circuit elements are mounted on upper surfaces of the island portions, and are connected to corresponding bonding portions by wirings. Two leads are adapted to be connected to positive and negative sides of a power source, and another lead is an output lead for providing alternating-current power. Lower surfaces of the island portions are attached to an upper surface of a circuit board. The circuit board, the circuit elements, and the lead frame are encapsulated by a resin, so that the lead portions are not covered by the resin.

11 Claims, 9 Drawing Sheets

(51) Int. Cl.
| | |
|---|---|
| *H01L 21/56* | (2006.01) |
| *H01L 23/31* | (2006.01) |
| *H01L 23/433* | (2006.01) |
| *H01L 23/495* | (2006.01) |
| *H01L 25/07* | (2006.01) |
| *H01L 21/48* | (2006.01) |
| *H01L 23/29* | (2006.01) |
| *H01L 25/18* | (2006.01) |
| *H01L 25/00* | (2006.01) |
| *H05K 1/02* | (2006.01) |
| *H05K 1/18* | (2006.01) |
| *H01L 23/00* | (2006.01) |

(52) U.S. Cl.
CPC .......... *H01L 21/565* (2013.01); *H01L 23/293* (2013.01); *H01L 23/3121* (2013.01); *H01L 23/4334* (2013.01); *H01L 23/49531* (2013.01); *H01L 23/49541* (2013.01); *H01L 23/49575* (2013.01); *H01L 24/85* (2013.01); *H01L 25/072* (2013.01); *H01L 25/18* (2013.01); *H01L 25/50* (2013.01); *H05K 1/0203* (2013.01); *H05K 1/181* (2013.01); *H01L 24/45* (2013.01); *H01L 24/48* (2013.01); *H01L 2224/32245* (2013.01); *H01L 2224/45015* (2013.01); *H01L 2224/45124* (2013.01); *H01L 2224/48091* (2013.01); *H01L 2224/48106* (2013.01); *H01L 2224/48137* (2013.01); *H01L 2224/48139* (2013.01); *H01L 2224/48247* (2013.01); *H01L 2224/48472* (2013.01); *H01L 2224/73265* (2013.01); *H01L 2924/1203* (2013.01); *H01L 2924/13055* (2013.01); *H01L 2924/13091* (2013.01); *H01L 2924/14* (2013.01); *H01L 2924/181* (2013.01); *H01L 2924/19105* (2013.01); *H01L 2924/19107* (2013.01); *Y10T 29/4916* (2015.01)

(58) Field of Classification Search
USPC .......... 438/107, 15, 125; 257/177, 676, 691; 361/772; 363/21.04; 29/837
See application file for complete search history.

(56) References Cited

U.S. PATENT DOCUMENTS

| | | | |
|---|---|---|---|
| 5,061,990 A | 10/1991 | Arakawa et al. | |
| 5,151,039 A | 9/1992 | Murphy | |
| 5,352,925 A | 10/1994 | Sudoh et al. | |
| 5,408,383 A | 4/1995 | Nagasaka et al. | |
| 5,438,478 A | 8/1995 | Kondo et al. | |
| 5,442,229 A | 8/1995 | Mori et al. | |
| 5,492,842 A * | 2/1996 | Eytcheson | H01L 25/18 29/593 |
| 5,508,563 A | 4/1996 | Tazawa et al. | |
| 5,539,254 A * | 7/1996 | Eytcheson | H01L 25/18 257/691 |
| 5,557,144 A | 9/1996 | Rosenstock et al. | |
| 5,586,388 A | 12/1996 | Hirao et al. | |
| 5,586,389 A | 12/1996 | Hiroa et al. | |
| 5,610,799 A | 3/1997 | Kato | |
| 5,646,827 A | 7/1997 | Hirao et al. | |
| 5,657,203 A | 8/1997 | Hirao et al. | |
| 5,659,462 A * | 8/1997 | Chen | B23Q 3/00 363/21.04 |
| 5,770,888 A | 6/1998 | Song et al. | |
| 5,834,336 A | 11/1998 | Maheshwari et al. | |
| 5,883,465 A | 3/1999 | Inoguchi et al. | |
| 6,054,757 A | 4/2000 | Kobayashi | |
| 6,084,309 A | 7/2000 | Kawashima et al. | |
| 6,097,081 A | 8/2000 | Masuda et al. | |
| 6,163,461 A | 12/2000 | Watanabe | |
| 6,291,880 B1 | 9/2001 | Ogawa et al. | |
| 6,313,598 B1 | 11/2001 | Tamba et al. | |
| 6,315,465 B1 | 11/2001 | Mizue et al. | |
| 6,414,381 B1 | 7/2002 | Takeda | |
| 6,432,750 B2 | 8/2002 | Jeon et al. | |
| 6,597,416 B1 | 7/2003 | Momose | |
| 6,740,969 B1 | 5/2004 | Hirashima | |
| 6,841,869 B1 | 1/2005 | Triantafyllou et al. | |
| 7,449,774 B1 | 11/2008 | Jeun et al. | |
| 7,776,658 B2 | 8/2010 | Liu et al. | |
| 7,791,178 B2 | 9/2010 | Bang et al. | |
| 2001/0003059 A1 | 6/2001 | Miyazaki et al. | |
| 2001/0004127 A1 | 6/2001 | Miyazaki et al. | |
| 2002/0070461 A1 | 6/2002 | Miyazaki et al. | |
| 2002/0140070 A1 | 10/2002 | Sook Lim et al. | |
| 2004/0080056 A1 | 4/2004 | Lim et al. | |
| 2005/0151229 A1 | 7/2005 | Imaizumi et al. | |
| 2005/0161782 A1 | 7/2005 | Kanakubo | |
| 2005/0212113 A1 | 9/2005 | Iimura et al. | |
| 2005/0242424 A1 | 11/2005 | Isokawa | |
| 2006/0091512 A1 | 5/2006 | Shinohara | |
| 2006/0113562 A1 * | 6/2006 | Jeun | H01L 23/4334 257/177 |
| 2007/0045818 A1 | 3/2007 | Kuan et al. | |
| 2007/0210392 A1 | 9/2007 | Sakakibara et al. | |
| 2007/0210424 A1 | 9/2007 | Ho et al. | |
| 2008/0009153 A1 | 1/2008 | Tan et al. | |
| 2008/0017998 A1 | 1/2008 | Pavio | |
| 2008/0054437 A1 | 3/2008 | Hwang | |
| 2008/0061410 A1 | 3/2008 | Imaizumi et al. | |
| 2008/0099922 A1 | 5/2008 | Sakamoto | |
| 2008/0111756 A1 | 5/2008 | Ochi et al. | |
| 2008/0119065 A1 * | 5/2008 | Takakusaki | H01L 21/565 439/74 |
| 2008/0150094 A1 | 6/2008 | Anderson | |
| 2008/0157301 A1 | 7/2008 | Ramakrishna | |
| 2008/0191340 A1 | 8/2008 | Stolze et al. | |
| 2008/0203552 A1 | 8/2008 | Kim et al. | |
| 2008/0217156 A1 | 9/2008 | Nishimura et al. | |
| 2009/0011548 A1 | 1/2009 | Iimura et al. | |
| 2009/0058407 A1 * | 3/2009 | Kanekawa | G01D 5/14 324/228 |
| 2009/0096041 A1 | 4/2009 | Sakakibara et al. | |
| 2009/0129038 A1 * | 5/2009 | Takakusaki | H01L 23/49861 361/772 |
| 2009/0230487 A1 | 9/2009 | Saitoh et al. | |
| 2009/0236721 A1 | 9/2009 | Meguro | |
| 2010/0052141 A1 | 3/2010 | Robinson | |
| 2010/0065960 A1 | 3/2010 | Mino et al. | |
| 2010/0091464 A1 | 4/2010 | Ohnishi et al. | |
| 2010/0136745 A1 | 6/2010 | Hwang | |
| 2010/0300742 A1 | 12/2010 | Ihara et al. | |
| 2011/0042812 A1 | 2/2011 | Kayukawa et al. | |
| 2011/0050222 A1 * | 3/2011 | Ueno | G01R 15/207 324/253 |
| 2011/0116236 A1 | 5/2011 | Akahori | |
| 2012/0074552 A1 * | 3/2012 | Mashimo | H01L 21/565 257/676 |

FOREIGN PATENT DOCUMENTS

| | | |
|---|---|---|
| JP | 10-200037 | 7/1998 |
| JP | 11-233712 | 8/1999 |
| JP | 11-307721 | 11/1999 |
| JP | 2004-273749 | 9/2004 |
| JP | 2005-150595 | 6/2005 |
| JP | 2005-327967 | 11/2005 |
| JP | 2009-111154 | 5/2009 |

* cited by examiner

US 9,793,826 B2

1
METHOD OF MANUFACTURING A CIRCUIT DEVICE

CROSS REFERENCE TO RELATED, COPENDING APPLICATION

Related subject matter is found in copending U.S. patent application Ser. No. 15/054,233, filed Feb. 26, 2016, entitled "Hybrid Circuit Device," invented Shigeaki Mashimo et al., and assigned to the assignee hereof.

This application is a division of U.S. patent application Ser. No. 13/242,202, filed Sep. 23, 2011, entitled "Circuit Device and Method of Manufacturing the Same," and claims priority from Japanese Patent Application Number JP 2010-213694 filed on Sep. 24, 2010, the content of which is incorporated herein by reference in its entirety.

BACKGROUND

1. Field

The invention relates to a circuit device and a method of manufacturing the same, and more particularly relates to a circuit device incorporating a power semiconductor element that performs switching of a large current and to a method of manufacturing the same.

2. Description of the Related Art

A structure of a conventional hybrid integrated circuit device 100 is described with reference to FIG. 9. This technology is described for instance in Japanese Patent Application Publication No. Hei 5-102645. A conductive pattern 103 is formed on a surface of a rectangular substrate 101 with an insulative layer 102 interposed therebetween. A certain electrical circuit is formed by fixedly attaching circuit elements on the conductive pattern 103. Here, a semiconductor element 105A and a chip element 105B as the circuit elements are connected to the conductive pattern 103. Leads 104 are connected to pads 109 each formed of a part of the conductive pattern 103 at a peripheral portion of the substrate 101 and function as external terminals. An encapsulating resin 108 has a function of encapsulating the electrical circuit formed on the surface of the substrate 101.

The semiconductor element 105A is a power element through which a large current of about several to several hundreds of amperes flows for example and thus generates an extremely large amount of heat. Thus, the semiconductor element 105A has been placed on an upper portion of a heat sink 110 placed on the conductive pattern 103. The heat sink 110 is made of a piece of metal such as copper having a size of about length×width×thickness=10 mm×10 mm×1 mm for example.

However, in the hybrid integrated circuit device 100 having the structure, to form a circuit such as an inverter circuit for converting a large current on the upper surface of the substrate 101, the conductive pattern 103 needs to be wide to secure a current capacity. Thus, downsizing of the hybrid integrated circuit device 100 is hindered. Moreover, a heat sink needs to be prepared for each semiconductor element to secure heat dissipation, whereby the cost is increased.

2

Figure 3:
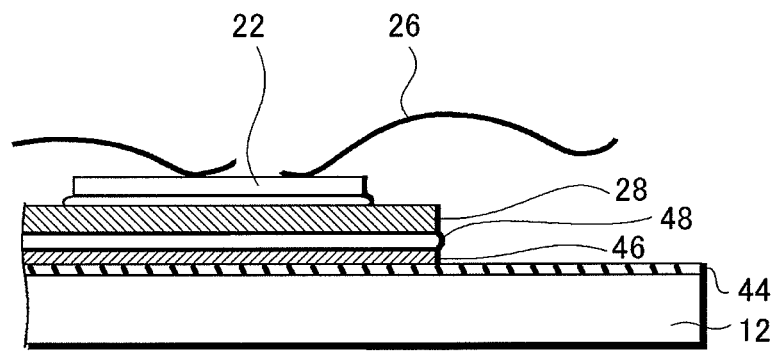
Figure 3:
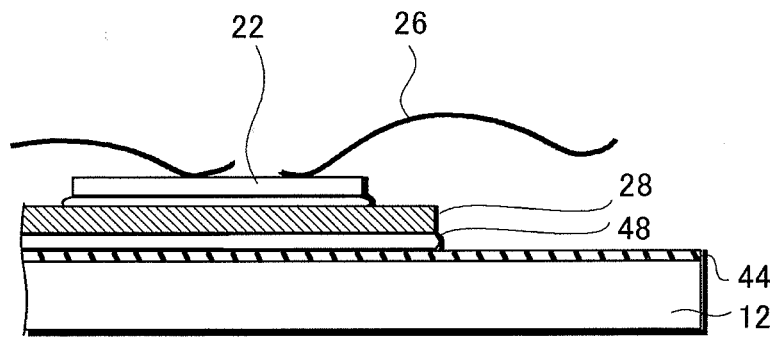

FIGS. 3A and 3B are cross-sectional views partially showing the circuit device according to the preferred embodiment of the invention.

Figure 4:
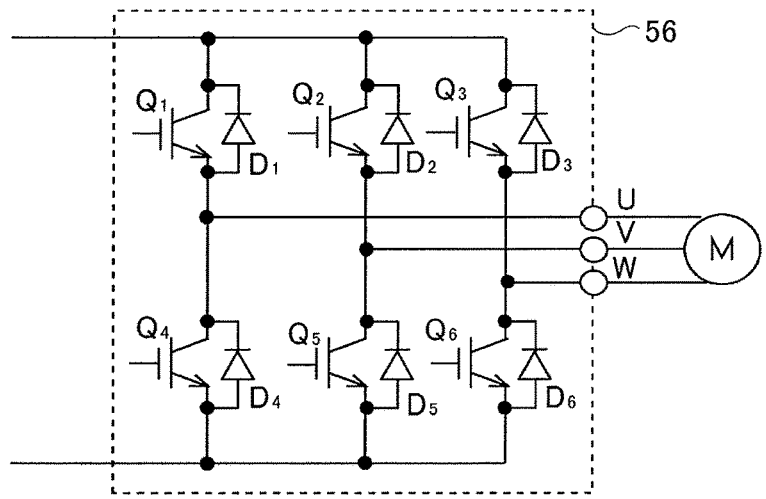
Figure 4:
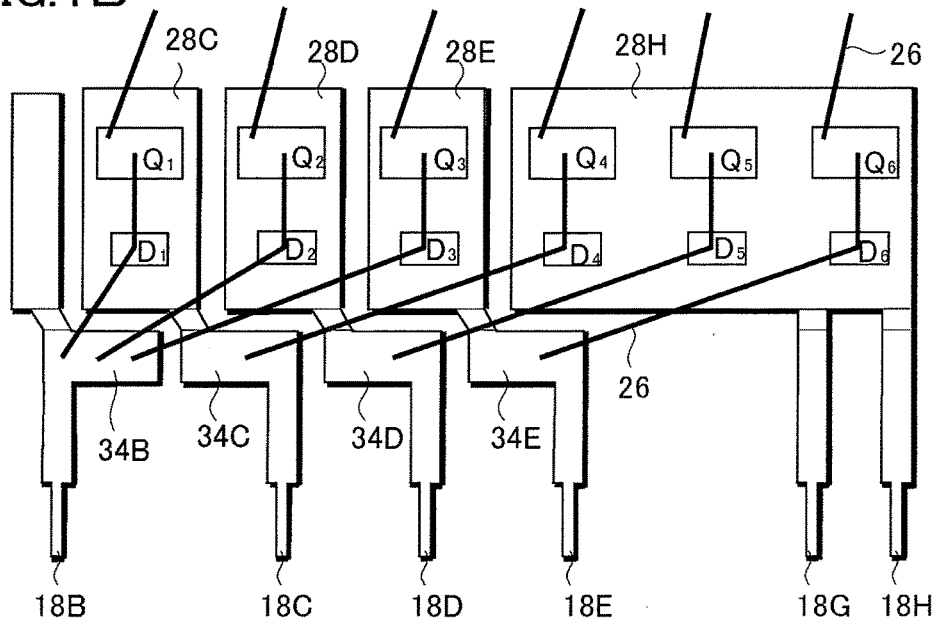
Figure 4:
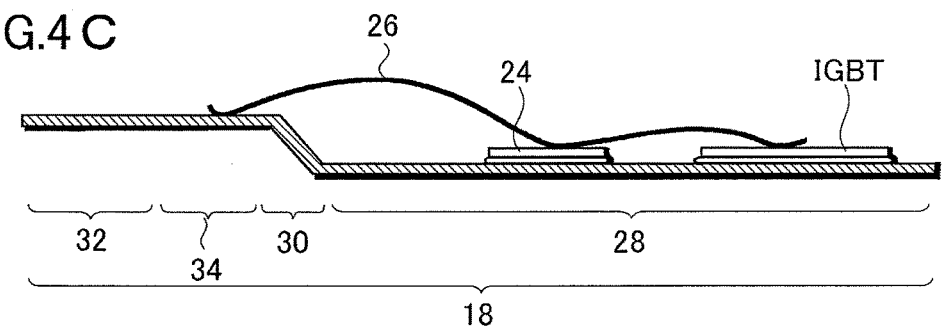

FIG. 4A is a circuit diagram of an inverter circuit to be incorporated. FIG. 4B is an extracted plan view of the leads. FIG. 4C is a cross-sectional view showing the lead.

Figure 5:
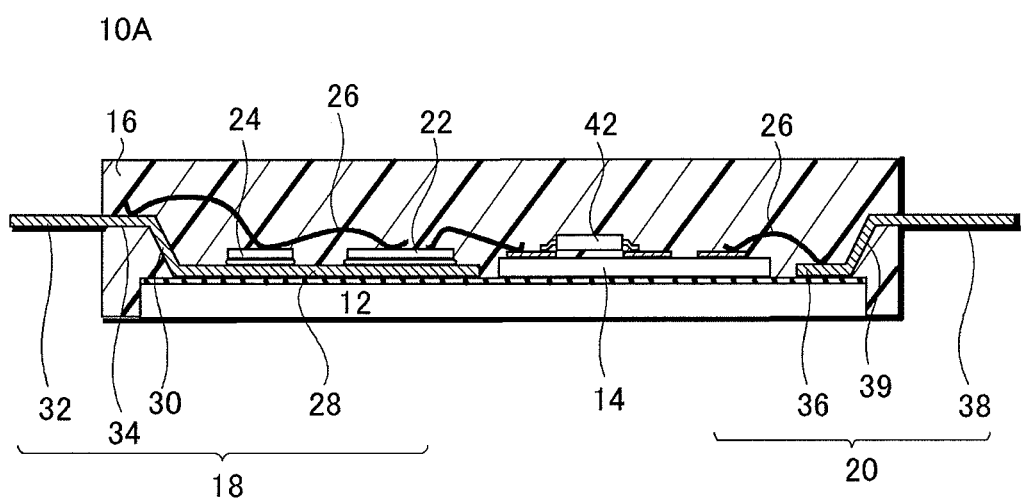

FIG. 5 is a cross-sectional view of a circuit device according to another preferred embodiment of the invention.

FIG. 6A is a plan view and FIG. 6B is a cross-sectional view showing a method of manufacturing the circuit device according to the preferred embodiment of the invention.

FIG. 7A is a plan view and FIG. 7B is a cross-sectional view showing the method of manufacturing the circuit device according to the preferred embodiment of the invention.

FIG. 8A is a plan view and FIG. 8B is a cross-sectional view showing the method of manufacturing the circuit device according to the preferred embodiment of the invention.

Figure 9:
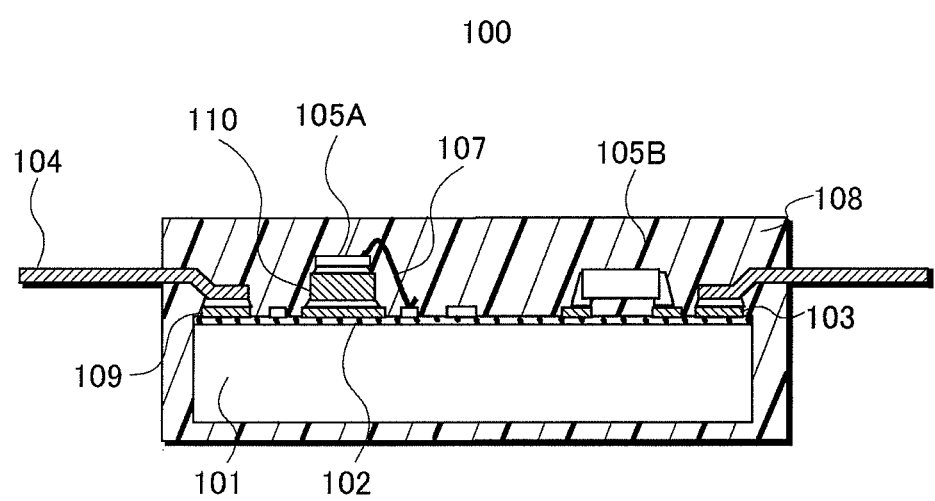

FIG. 9 is a cross-sectional view of a hybrid integrated circuit device described in Description of the Related Art.

The use of the same reference symbols in different drawings indicates similar or identical items.

DETAILED DESCRIPTION

First of all, a structure of a hybrid integrated circuit device 10 as an example of a circuit device is described with reference to FIGS. 1A through 5.

The structure of the hybrid integrated circuit device 10 according to this embodiment is described with reference to FIGS. 1A and 1B. FIG. 1A is a perspective view showing the hybrid integrated circuit device 10 as viewed from an obliquely upper direction. FIG. 1B is a cross-sectional view of the hybrid integrated circuit device 10.

Referring to FIGS. 1A and 1B, the hybrid integrated circuit device 10 includes a circuit board 12, leads 18 and 20 disposed on the upper surface of the circuit board 12, a transistor 22 and a diode 24 (circuit elements) disposed on an island portion 28 of the lead 18, and an encapsulating resin 16 integrally covering the components.

The circuit board 12 is a metal substrate mainly made of metal such as aluminum (Al) or copper (Cu). Specifically, the circuit board 12 has a size of about length×width×thickness=30 mm×15 mm×1.5 mm for example. When a substrate made of aluminum is used as the circuit board 12, both main surfaces of the circuit board 12 are subjected to alumite treatment. Here, the upper and the side surfaces of the circuit board 12 are covered with the encapsulating resin 16 and the lower surface is exposed to the outside. Thus, a heat sink can be brought into contact with the exposed lower surface of the circuit board 12, whereby the heat dissipation is improved. Alternatively, the lower surface of the circuit board 12 may be covered with the encapsulating resin 16 to secure moisture resistance and withstand voltage.

Referring to FIG. 1B, the leads 18 and 20 are respectively provided on the left and the right sides in the drawing. Here, a large number of leads 18 and 20 are disposed along two opposite sides of the circuit board 12. Instead, only the leads 18 may be disposed along one side, or the leads may be disposed along four sides.

A plurality of the leads 18 are provided along one side of the circuit board 12. The lead 18 includes the island portion 28, a slope portion 30, a bonding portion 34, and a lead portion 32 in this order from the inner side. The transistor 22 and a diode 24 are fixedly attached on the upper surface of the island portion 28 with a conductive adhesive such as solder. The lower surface of the island portion 28 is fixedly attached on the upper surface of the circuit board 12. Thus, the heat generated by the transistor 22 and the diode 24 during operation is favorably radiated outside through the island portion 28 and the circuit board 12. Providing the slope portion 30 in an intermediate portion of the lead 18 separates the left upper end of the circuit board 12 from the lead 18 and thus prevents short circuiting of the circuit board 12 and the lead 18. The bonding portion 34 is a portion connected to the transistor 22 and the diode 24 through a fine metal wire 26 (an aluminum wire having a diameter in a range from 20 µm to 500 µm, for example). A connection structure through the metal wire 26 is described later with reference to FIG. 4B. The lead portion 32 is a terminal portion that is led out from the encapsulating resin 16 to be used for insert mounting and the like.

A plurality of the leads 20 are provided at positions opposite to those of the leads 18. The lead 20 includes a bonding portion 36, a slope portion 39, and a lead portion 38 in this order from the inner side. The bonding portion 36 is fixedly attached on the upper surface of the circuit board 12 and is electrically connected to a control electrode of the transistor 22 mounted on the island portion 28. The lead portion 38 is led out from the encapsulating resin 16 through the slope portion 39.

The leads 18 and the leads 20 have different functions. Specifically, on the leads 18, the transistors 22 and the diodes 24 are mounted to form an inverter circuit. Thus, the leads 18 also serve as paths through which direct-current power to be converted by the inverter circuit and alternate-current power obtained by the conversion pass. Moreover, the leads 18 are each formed of a thick piece of metal such as copper having a thickness of about 500 µm and thus also functions as a heat sink. Meanwhile, the lead 20 is connected to the control electrode of the transistor 22 and thus serves as a connection terminal through which a control signal passes.

Here, the transistor 22 and the like are connected through one fine metal wire 26 in the figure. Instead, the electrical connection of the transistor 22 may be achieved through multiple (two or three for example) fine metal wires 26. As connecting means connecting the transistor 22 and the like, a metal foil formed by ribbon bonding may be employed in place of the fine metal wire.

Figure 2:
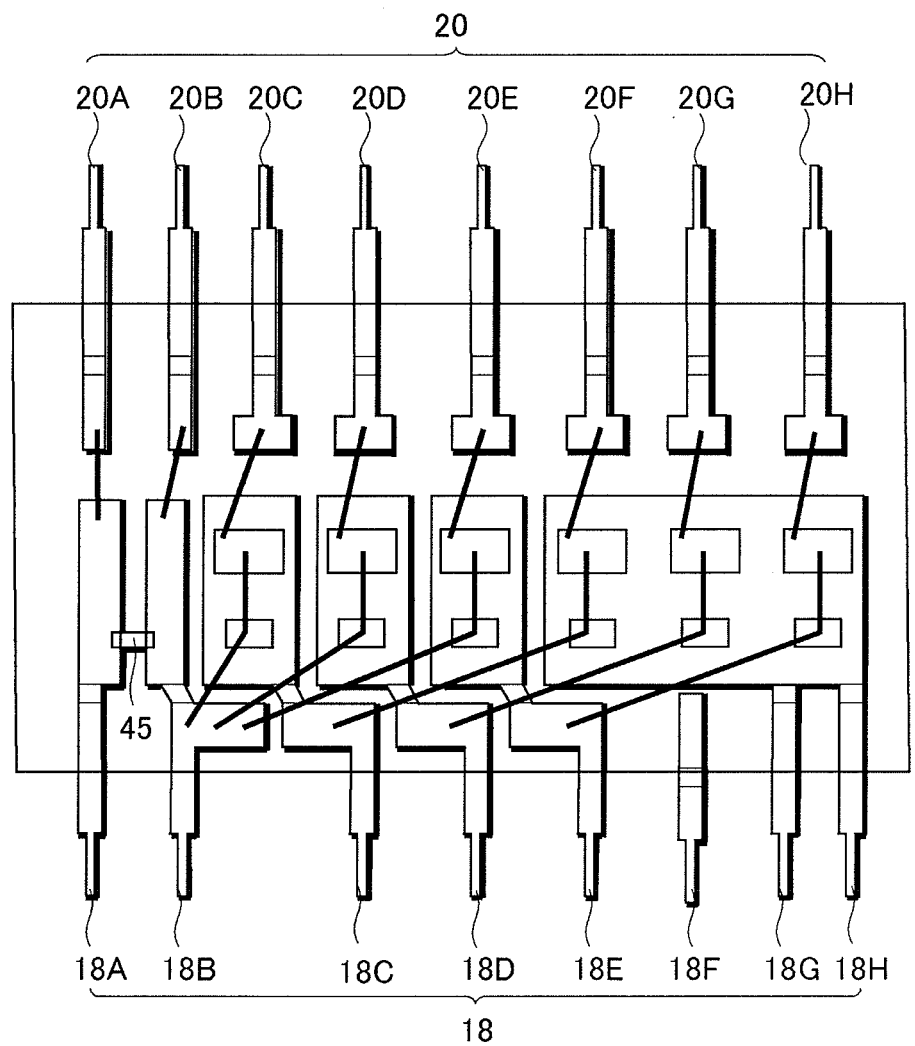
FIG. 2 is a plan view of the circuit device according to the preferred embodiment of the invention.

Structures of the leads 18 and 20 are described with reference to FIG. 2. Referring to the figure, leads 18A to 18H and leads 20A to 20H are disposed opposite to each other.

Of the leads 18A to 18H, the leads 18A and 18H respectively disposed on the left and the right ends are leads through which a direct current is supplied from the outside, and the leads 18c, 18D and 18E are leads through which alternate-current power of three phases obtained by the conversion in the incorporated inverter circuit is outputted. A resistor 45 for detecting a current value is disposed between the leads 18A and 18B.

On the upper surfaces of the leads 18C to 18E, the transistors and the diodes that form the three phase inverter circuit are mounted. This is described in detail later with reference to FIG. 4.

Of the leads 20A to 20H, the leads 20A and 20B are respectively connected to the leads 18A and 18B through the fine metal wires 26 and are used for detecting the current value. The leads 20C to 20H are connected to the control electrodes of the transistors mounted on the leads 18C to 18H. Specifically, when the transistor is an IGBT, the leads 18C to 18H are connected to gate electrodes of the IGBTs.

Structures in which the island portion 28 of the lead is fixedly attached on the upper surface of the circuit board 12 is described with reference to cross-sectional views of FIG. 3A and FIG. 3B.

Referring to FIG. 3A, the upper surface of the circuit board 12 made of metal such as aluminum is covered with an insulative layer 44. The insulative layer 44 is made of epoxy resin or the like highly filled with filler such as $AL_2O_3$ in an amount of about 60% by weight to 80% by weight, for example. A conductive pattern 46 made of metal such as copper and having a thickness of about 50 µm is formed on the upper surface of the insulative layer 44. The island portion 28 of the lead is fixedly attached on the upper surface of the conductive pattern 46 with an adhesive 48 such as solder provided therebetween. Thus, the heat generated by the transistor 22 during operation is radiated outside through the island portion 28, the adhesive 48, the conductive pattern 46, and the circuit board 12.

In FIG. 3B no conductive pattern is formed on the upper surface of the insulative layer 44. The lower surface of the island portion 28 is fixedly attached on the upper surface of the insulative layer 44 with the conductive or insulative adhesive 48 provided therebetween.

The bonding portion 36 of the lead 20 shown in FIG. 1B is fixedly attached on the upper surface of the circuit board 12 in a structure similar to that described above.

Referring to FIGS. 4A, 4B, and 4C, a structure in a case where the three phase inverter circuit is incorporated in the hybrid integrated circuit device 10 is described. FIG. 4A is a circuit diagram of the inverter circuit, FIG. 4B is a plan view showing a configuration of the leads, and FIG. 4C is a cross-sectional view of the lead 18.

Referring to FIG. 4A, the inverter circuit 56 includes six IGBTs (Q1 to Q6) and six diodes (D1 to D6). The IGBTs Q1 to Q3 are high side transistors while the IGBTs Q4 to Q6 are low side transistors. The flywheel diodes (D1 to D6) are connected to the collector electrode and the emitter electrode of the respective IGBTs (Q1 to Q6) in inverse parallel. By thus connecting the flywheel diodes with the IGBTs in inverse parallel, the IGBTs are prevented from being broken by an over voltage due to counter electromotive force generated in an inductive load. Here, other transistors such as a MOS and like may be used in place of the IGBT.

The IGBTs (Q1) and (Q4) are serially connected and exclusively ON/OFF controlled. The alternate-current power of U phase is outputted to the outside from the midpoint of the IGBTs (Q1) and (Q4) through the lead. The IGBTs (Q2) and (Q5) are serially connected and the alternate-current power of V phase is outputted to the outside from the midpoint of the IGBTs (Q2) and (Q5) that are exclusively ON/OFF controlled. The IGBTs (Q3) and (Q6) are serially connected and the alternate-current power of W phase is outputted to the outside from the midpoint of the IGBTs (Q3) and (Q6) that are exclusively ON/OFF controlled. Switching of the IGBTs is controlled by the control element positioned outside the device.

With this structure, the inverter circuit 56 converts received direct-current power into alternate-current power of three phases (U, V, W) which rotationally drives a motor M as a load.

Referring to FIG. 4B, the IGBTs and the diodes are fixedly attached on the upper surfaces of the island portions 28C to 28H of the leads 18C to 18H with a conductive adhesive such as solder. Specifically, the IGBT (Q1) and the diode D1 are mounted on the island portion 28C of the lead 18C, while the IGBT (Q2) and the diode D2 are mounted on the island portion 28D of the lead 18D. The IGBT (Q3) and the diode D3 are mounted on the island portion 28E of the lead 18E, while three IGBTs (Q4 to Q6) and three diodes D4 to D6 are mounted on the island portion 28H of the lead 18H. A collector electrode formed on the back surface of each IGBT and a cathode electrode of each diode are connected to the upper surface of a corresponding island portion with a conductive adhesive such as solder.

The transistors and the diodes mounted on the island portions are connected with each other through the fine metal wires to form the inverter circuit. In this embodiment, the transistor and the diode mounted on each island are connected with a bonding portion of an adjacent lead through a fine metal wire.

Specifically, the IGBT (Q1) and the diode D1 mounted on the island portion 28C of the lead 18C respectively have an emitter electrode and an anode electrode connected to a bonding portion 34B of the lead 18B through the fine metal wire 26. The IGBT (Q2) and the diode D2 mounted on the island portion 28D of the lead 18D respectively have an emitter electrode and an anode electrode connected to a bonding portion 34C of the lead 18C through the fine metal wire 26. The IGBT (Q3) and the diode D3 mounted on the island portion 28E of the lead 18E respectively have an emitter electrode and an anode electrode connected to a bonding portion 34D of the lead 18D through the fine metal wire 26.

Moreover, the IGBTs (Q4 to Q6) and the diodes D4 to D6 mounted on the island portion 28H connected to the negative side of a direct-current power source are connected to the respective bonding portions 34C to 34E of the leads 18D to 18F. Specifically, an emitter electrode of the IGBT (Q4) and an anode electrode of the diode D4 are connected to the bonding portion 34C of the lead 18C through the fine metal wire 26. An emitter electrode of the IGBT (Q5) and an anode electrode of the diode D5 are connected to the bonding portion 34D of the lead 18D through the fine metal wire 26. An emitter electrode of the IGBT (Q6) and an anode electrode of the diode D6 are connected to the bonding portion 34E of the lead 18E through the fine metal wire 26.

In this embodiment, the adjacent leads are connected with each other through the fine metal wires. The fine metal wire 26 connecting the IGBT (Q4) and the diode D4 with the bonding portion 34C of the lead 18C is formed to pass above the leads 18D and 18E. If the leads 18B to 18H are entirely flat, the fine metal wires 26 formed in such a complex manner may contact with each other and cause short circuiting. In this embodiment, the bonding portion 34 to which the fine metal wire is connected is positioned above the island portion 28 with the slope portion 30 provided therebetween as shown in FIG. 4C. Thus, the fine metal wires formed in a complex manner to form the inverter circuit are prevented from being in contact and causing short circuiting.

Furthermore, in this embodiment, no conductive pattern is formed on the upper surface of the circuit board 12 and the transistor 22 and the diode 24 are mounted on the island portion 28 of the lead 18 placed on the upper surface of the circuit board 12 as shown in FIG. 1B. Thus, the leads 18 of the present embodiment not only serve as external output terminals but also serve as the conductive pattern in Description of the Related Art. The island portion 28 of the lead 18 has a thickness of about 500 μm, for example, and thus is formed to have a thickness larger than that (50 μm) of the conductive pattern formed on the upper surface of the circuit board described in Description of the Related Art. The thin conductive pattern is formed over a wide area to deal with a large current of about several tens of amperes in the conventional case. In the present embodiment however, the lead 18 is thick and thus has a large cross-sectional area. Thus the area occupied by the lead 18 can be made smaller compared with the conventional conductive pattern. This contributes to the downsizing of the device as a whole.

Figure 1:
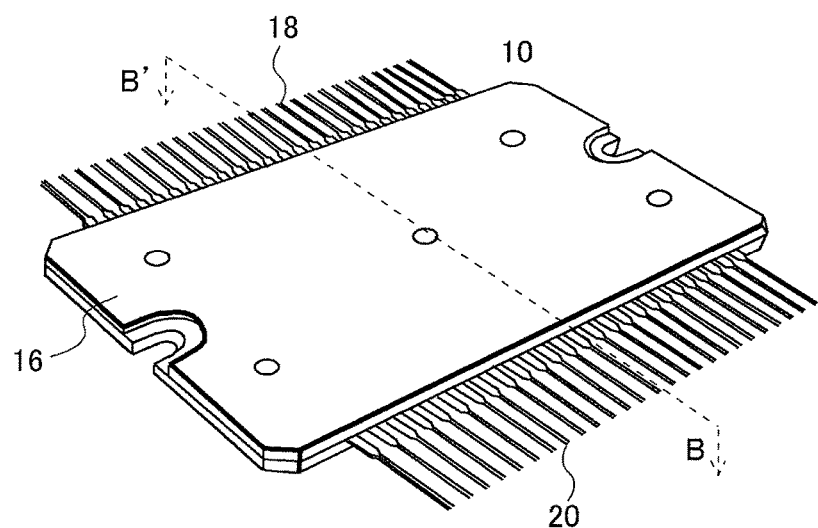
FIG. 1A is a perspective view and FIG. 1B is a cross-sectional view showing a circuit device according to a preferred embodiment of the invention.
Figure 1:
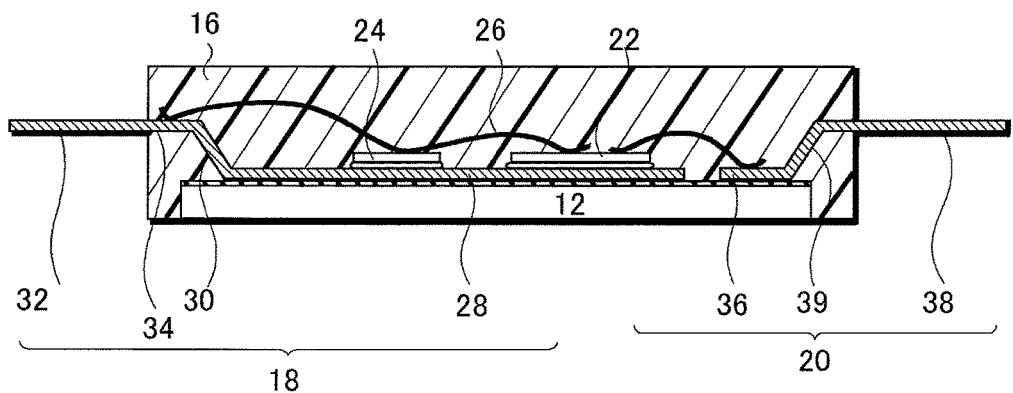

A structure of a hybrid integrated circuit device 10A of another preferred embodiment is described with reference to FIG. 5. A basic structure of the hybrid integrated circuit device 10A shown in this figure is same as that of the device shown in FIG. 1. The difference from the structure in FIG. 1 is that a control board 14 is fixedly attached on the upper surface of the circuit board 12.

Specifically, the island portion 28 of the lead 18 is fixedly attached on left side in the drawing of the upper surface of the circuit board 12 as in the structure described above.

The control board 14 having a control element 42 mounted on its upper surface is fixedly attached on the right side in the drawing of the upper surface of the circuit board. The control board 14 is formed of an inexpensive insulative substrate such as a glass epoxy substrate. A conductive pattern is formed on the upper surface of the control board 14. The control element 42 in a form of a resin encapsulated package is connected to the conductive pattern. The control element 42 is connected to the control electrode of the transistor 22 through the conductive pattern formed on the upper surface of the control board 14 and the fine metal wire. Thus, the transistor 22 in the inverter circuit is controlled by a control signal supplied from the control element 42. The control element 42 is connected to the lead 20 on the right side of the drawing through the conductive pattern on the control board 14 and the fine metal wire 26.

By providing the control element 42 in the hybrid integrated circuit device 10A, a module in which the inverter circuit and the control circuit are integrated is formed, whereby the device as a whole can have a high performance. Moreover, the control element 42 is mounted on the control board 14 placed on the upper surface of the circuit board 12 made of a metal material, whereby the control element 42 is prevented from being over heated. Specifically, even when the heat generated by the transistor 22 during operation is transmitted to the circuit board 12 made of metal, the transmission of the heat to the control element 42 is prevented by the control board 14 made of an insulative material such as a resin material.

The control element 42 may be mounted on the conductive pattern formed directly on the upper surface of the circuit board 12 without disposing the control board 14 on the upper surface of the circuit board 12.

Figure 6:
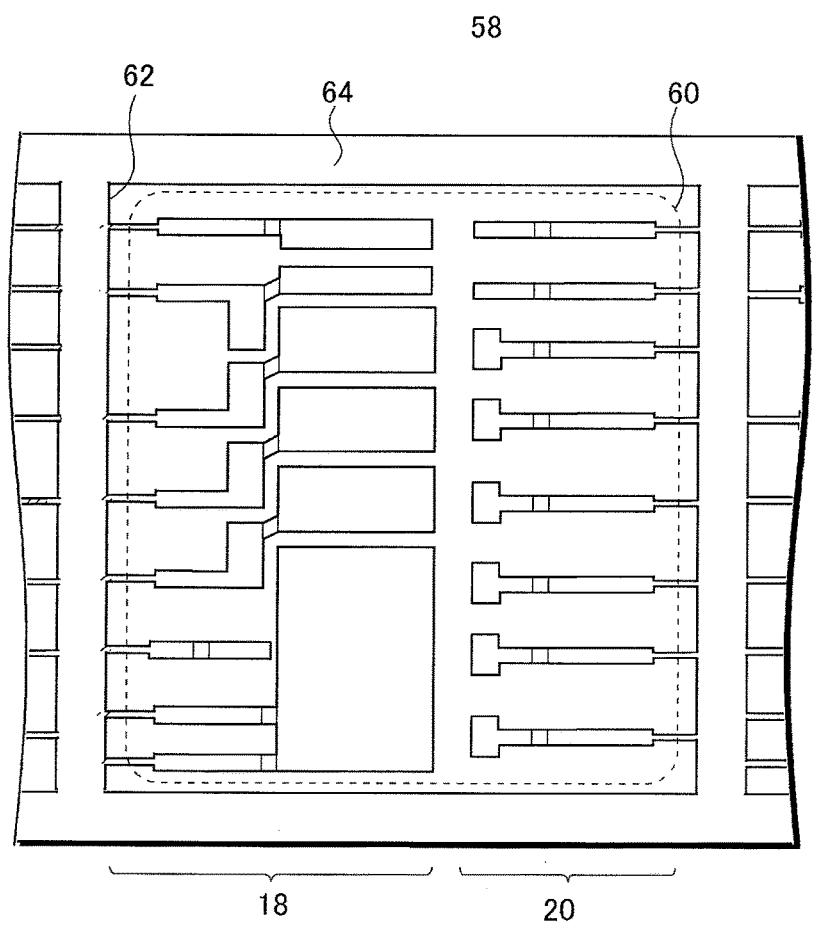
Figure 6:
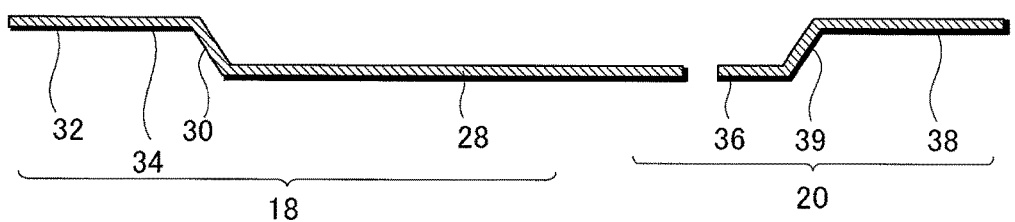
Figure 7:
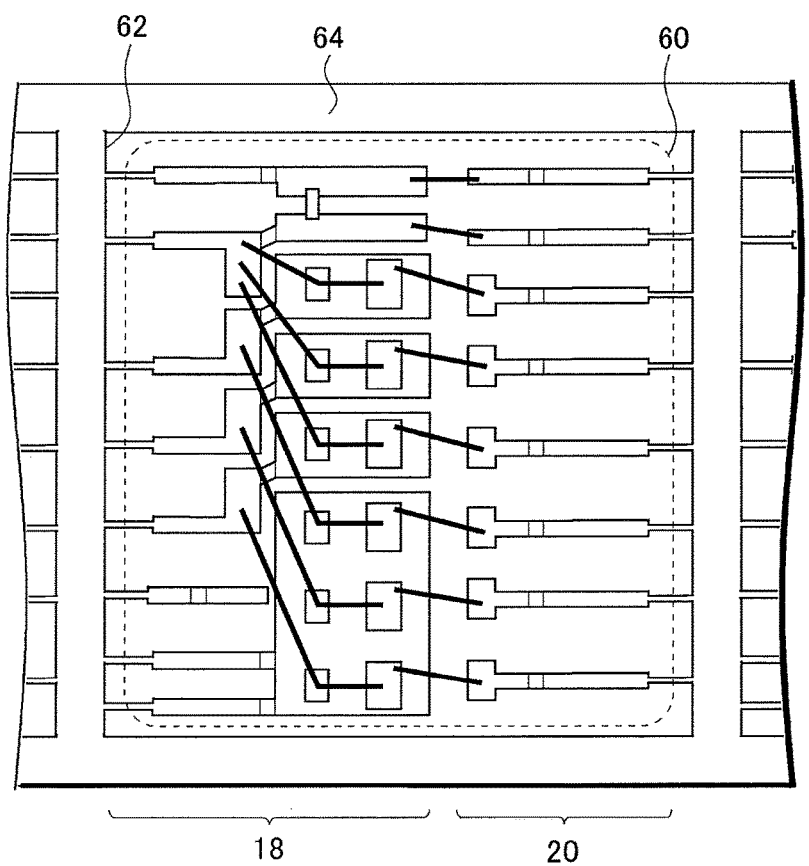
Figure 7:
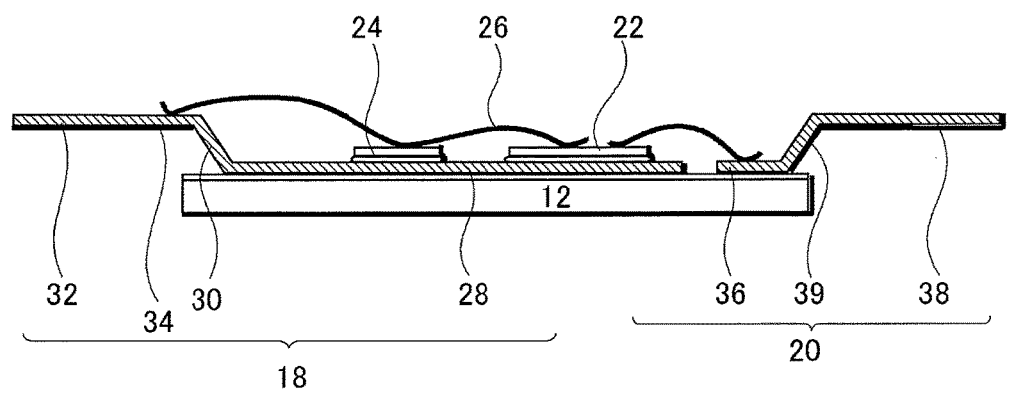
Figure 8:
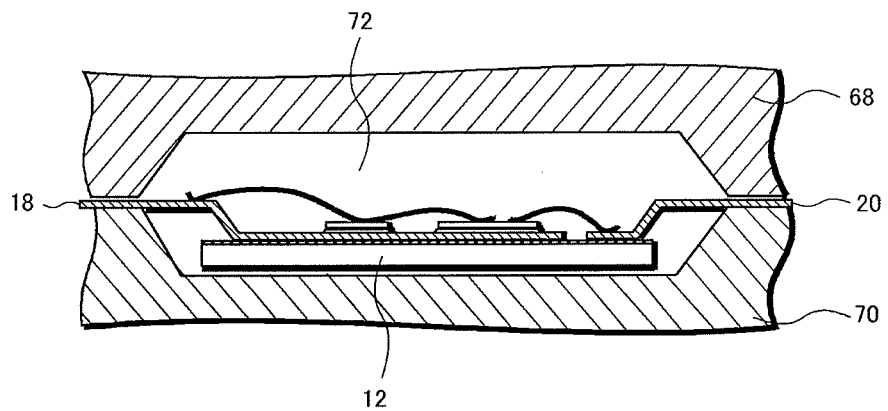
Figure 8:
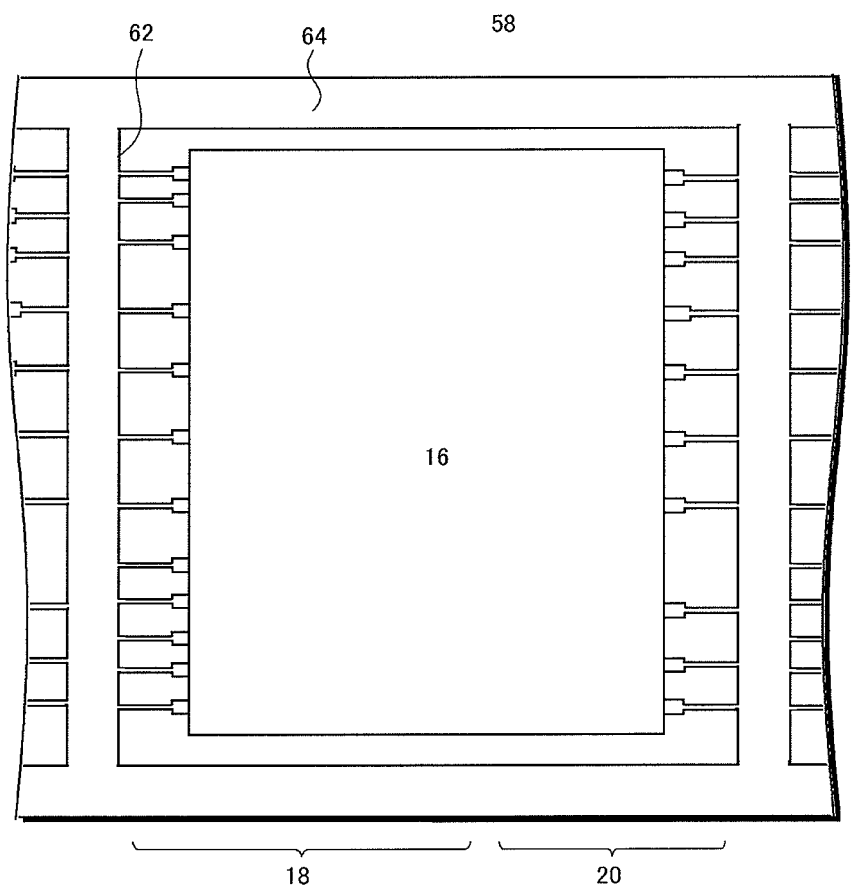

Next, a method of manufacturing the hybrid integrated circuit device 10 having the above described structure is described with reference to FIG. 6 to FIG. 8.

Referring to FIGS. 6A and 6B, first of all, a lead frame 58 including multiple leads 18 and 20 are prepared. FIG. 6A is a plan view showing one unit 60 to be provided in the lead frame 58. FIG. 6B is a cross-sectional view of the unit 60.

Referring to FIG. 6A, the unit 60 includes a large number of leads 18 and 20 forming a single hybrid integrated circuit device. Each of the leads 18 and 20 has one end positioned in an area on which the circuit board 12 is to be placed. The leads 18 are disposed on the left side of the unit 60 in the drawing and are provided with the island portions 28 on which the transistors and the diodes are mounted as described above. The leads 20 are disposed on the right side in the drawing and serve as external connection terminals and also are responsible for the connection of the control electrode of the transistor and mechanically supporting the control board. An outer end of each of the leads 18 and 20 is integrally supported by a tie bar 62 continuous with an outer frame 64.

As shown in FIG. 6B, the lead 18 on the left side in the drawing includes the island portion 28, the slope portion 30, the bonding portion 34, and the lead portion 32. Here, the island portion 28 is a portion on which a circuit element such as the transistor is mounted. The bonding portion 34 is a portion to which the fine metal wire is connected. The lead 20 on the right side of the drawing includes the bonding portion 36, the slope portion 39, and the lead portion 38.

The lead frame 58 includes a plurality of the units 60 having the structure within the frame-shaped outer frame 64. The following steps are collectively performed on the units 60.

Referring to FIGS. 7A and 7B, the circuit elements and the circuit board are fixedly attached on the leads. FIG. 7A is a plan view showing the present step and FIG. 7B is a cross-sectional view.

Specifically, the back surface electrode of the transistor 22 is fixedly attached on the island portion 28 of the lead 18 with a conductive adhesive such as solder. The back surface electrode of the diode 24 is fixedly attached in a similar manner. Then, the electrode of the transistor 22 is connected to the bonding portion 34 provided at the intermediate portion of the lead 18 through the fine metal wire 26. Similarly, the control electrode (gate electrode) of the transistor 22 is connected to the bonding portion 36 of the lead 20 through the fine metal wire 26.

Referring to FIG. 7B, the island portion 28 of the lead 18 is fixedly attached on the upper surface of the circuit board 12. The lower surface of the island portion 28 may be fixedly attached on the upper surface of the circuit board 12 as follows. Specifically, the island portion 28 may be fixedly attached on the conductive pattern 46 formed on the upper surface of the circuit board 12 as shown in FIG. 3A or may be directly fixedly attached on the upper surface of the insulative layer 44 covering the upper surface of the circuit board 12 as shown in FIG. 3B.

In this step, the transistors 22 and the diodes 24 mounted on the island portions 28 of the leads 18 are connected to the bonding portions 34 through the fine metal wires 26 so that the inverter circuit is formed in each unit 60. The connection structure using the fine metal wires 26 is as described with reference to FIG. 4. In this embodiment, the fine metal wires 26 are formed in a complex manner to form the inverter circuit. Accordingly, when the leads 18 have a flat shape, the fine metal wires 26 may be in contact with each other and cause short circuiting. In this embodiment, the bonding portion 34 to which the fine metal wire 26 is connected is disposed at a higher position than the island portion 28 so that the fine metal wires 26 are separated from one another to prevent short circuiting.

Here, to manufacture the hybrid integrated circuit device 10A shown in FIG. 5, the control board 14 on which the control element 42 is mounted is disposed on the upper surface of the circuit board 12 and the control board 14, the transistor 22, and the lead 20 are connected to each other through the fine metal wires 26.

Referring to FIGS. 8A and 8B, next, an encapsulating resin is formed to cover the circuit board 12. FIG. 8A is a cross-sectional view showing the step of molding the circuit board 12 using a mold and FIG. 8B is a plan view showing the lead frame 58 after the molding.

Referring to FIG. 8A, the circuit board 12 fixed to the lead frame is placed in a cavity 72 defined by an upper mold 68 and a lower mold 70. Here, the position of the circuit board 12 in the cavity 72 is fixed by clamping the leads 18 and 20 with the upper mold 68 and the lower mold 70. Then, the circuit board 12 and the circuit elements and the like are encapsulated by injecting resin into the cavity 72 through a gate provided to the mold. In this step, transfer molding using a thermosetting resin or injection molding using a thermoplastic resin is performed. The encapsulating structure of the circuit board 12 is not limited to the resin encapsulation and an encapsulation by potting or an encapsulation using a case member may also be employed.

Referring to FIG. 8B, after the molding step is completed, the leads 18 and 20 are separated from the lead frame 58 by press work. Specifically, the leads 18 and 20 are individually separated at a portion at which the tie bar 62 is provided. Thus, the hybrid integrated circuit device as shown in FIG. 1 is separated from the lead frame 58.

According to the present invention, the lead is provided with the island portion and the bonding portion that are continuous through the slope portion. The island portion is fixedly attached on the upper surface of the circuit board while the bonding portion is disposed at a higher position than the upper surface of the circuit board to be separated therefrom. The circuit element mounted on the island portion and the bonding portion are connected with each other through connecting means. Thus, the connecting means made of a fine metal wire, for example, is prevented from contacting another connecting means and thus the short circuiting is prevented. Thus, a relatively complex circuit such as an inverter circuit can be formed with a plurality of leads and connecting means.

The above-disclosed subject matter is to be considered illustrative, and not restrictive, and the appended claims are intended to cover all such modifications, enhancements, and other embodiments that fall within the true scope of the claims. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of manufacturing a circuit device, comprising:
   providing a lead frame comprising a plurality of leads, each of the leads comprising an island portion, a bonding portion elevated from the island portion, a slope portion extending obliquely so as to connect the island portion and the bonding portion, and a lead portion extending from the bonding portion,
   mounting circuit elements on upper surfaces of the island portions;
   connecting the circuit elements to corresponding bonding portions by wirings wherein one of the plurality of leads is a first input lead, another of the plurality of leads is a second input lead, and yet another of the plurality of leads is an output lead for outputting alternating-current power obtained by converting direct-current power inputted through the first input lead and the second input lead;
   attaching lower surfaces of the island portions to an upper surface of a circuit board;
   encapsulating by a resin the circuit board, the circuit elements and the lead frame so that the lead portions are not covered by the resin;
   connecting the first input lead to a positive electrode of a direct-current power source; and
   connecting the second input lead to a negative electrode side of the direct-current power source.

2. The method of claim 1, wherein a first circuit element of the circuit elements mounted on an island portion of a first lead of the leads and a bonding portion of a second lead of the leads are electrically connected through a first wiring.

3. The method of claim 2, wherein there is no other lead between the first lead and the second lead.

4. The method of claim 2, wherein there is a third lead between the first lead and the second lead, and the first wiring passes above the third lead.

5. The method of claim 1, wherein mounting circuit elements on upper surfaces of the island portions comprises:
mounting a diode on an upper surface of the island portion of a first lead; and
mounting a transistor on the upper surface of the island portion of the first lead.

6. The method of claim 5, wherein mounting the transistor on the upper surface of the island portion of the first lead further comprises:
mounting an insulated gate bipolar transistor on the upper surface of the island portion of the first lead.

7. The method of claim 6, further comprising:
mounting an insulative control board on the upper surface of the circuit board; and
mounting a control element on an upper surface of the insulative control board.

8. The method of claim 7, further comprising:
connecting the control element to at least one of the circuit elements through at least one wiring.

9. The method of claim 8, wherein connecting the control element to the at least one of the circuit elements through the at least one wiring comprises:
connecting the control element to the transistor through the at least one wiring.

10. The method of claim 1, further comprising:
mounting an insulative control board on the upper surface of the circuit board; and
mounting a control element on an upper surface of the insulative control board.

11. The method of claim 10, further comprising:
connecting the control element to at least one of the circuit elements through at least one wiring.

* * * * *